(12) United States Patent
Lin et al.

(10) Patent No.: US 7,679,870 B2
(45) Date of Patent: Mar. 16, 2010

(54) ON-CHIP ESD PROTECTION CIRCUIT USING ENHANCEMENT-MODE HEMT/MESFET TECHNOLOGY

(75) Inventors: Cheng-Kuo Lin, Tao Yuan Shien (TW); Yu-Chi Wang, Tao Yuan Shien (TW); Joseph Liu, Tao Yuan Shien (TW); Jean Sun, Tao Yuan Shien (TW)

(73) Assignee: Win Semiconductors Corp., Taiwan (CN)

( * ) Notice: Subject to any disclaimer, the term of this patent is extended or adjusted under 35 U.S.C. 154(b) by 459 days.

(21) Appl. No.: 11/540,974

(22) Filed: Oct. 2, 2006

(65) Prior Publication Data
US 2008/0080108 A1    Apr. 3, 2008

(51) Int. Cl.
*H02H 9/00* (2006.01)
(52) U.S. Cl. .................. 361/56; 361/91.1; 361/111
(58) Field of Classification Search ............... 361/56, 361/91.1, 111
See application file for complete search history.

(56) References Cited

U.S. PATENT DOCUMENTS

| | | | | |
|---|---|---|---|---|
| 5,623,156 | A  * | 4/1997 | Watt | 257/355 |
| 6,826,025 | B2* | 11/2004 | Singh et al. | 361/56 |
| 2002/0188920 | A1* | 12/2002 | Lampaert et al. | 716/10 |
| 2004/0057172 | A1* | 3/2004 | Sun | 361/56 |
| 2008/0062595 | A1* | 3/2008 | Ping et al. | 361/56 |

* cited by examiner

*Primary Examiner*—Stephen W Jackson
*Assistant Examiner*—Terrence R Willoughby
(74) *Attorney, Agent, or Firm*—IP Fortune LLC; Ruay L. Ho (57) ABSTRACT

An on-chip circuit for protection against electrostatic discharge (ESD) is disclosed. Unlike conventional ESD protection circuit using high turn-on voltage diode string, the circuit uses a plural of enhancement-mode HEMT/MESFET triggered by a shorter diode string to shunt large ESD current for protected susceptive RF circuit. Further, by using dual-gate technology of enhancement-mode HEMT/MESFET, the on-chip ESD protection circuit has the less parasitic capacitance without expanding device size for vulnerable RF circuit.

14 Claims, 7 Drawing Sheets

ON-CHIP ESD PROTECTION CIRCUIT USING ENHANCEMENT-MODE HEMT/MESFET TECHNOLOGY

BACKGROUND OF THE INVENTION

1. Field of the Invention

The present invention relates to an electrostatic discharge (ESD) protection circuit on semiconductor chip, and more particular on III/V compound semiconductor chip, wherein a shunt circuit using enhancement-mode HEMT/MESFET technology for protection against ESD is connected between integrated circuit (IC) pad and ground.

2. Description of the Prior Art

An electrostatic discharge (ESD) event is the energy transfer between two bodies at different electrostatic potentials, either through contact or via an ionized ambient discharge (a spark). Therefore, an integrated circuit (IC) connected to external ports is vulnerable to ESD damaging pulses from the operating environment and peripherals. For the fact of ESD event, four models of ESD, Human-Body Model (HBM), Machine Model (MM), Charge-Device Model (CDM), and Field-Induced Model (FIM), are built to present the real damage to IC from ESD event. In order to protect the sensitive IC pad against ESD, an ESD protection circuit has to be connected between main IC pad and its external port. Traditional methods for ESD energy shunting are such as zener diodes, and regular complementary metal oxide semiconductor (CMOS) or bipolar clamp diodes. However, at the much higher data rates of USB 2.0, IEEE 1394, and digital visual interface (DVI) and at radio frequency (RF) operation, the parasitic impedance and capacitance of traditional protection devices can distort and deteriorate signal integrity. The parasitic effect may decrease signal magnitude and magnitude of power amplifier, narrow the applied bandwidth, and decrease the signal to noise ratio. Note that the whole chip space will have a significant increasing, if every port is connected with an ESD protection circuit.

One kind of ESD protection circuit especially for RF component was disclosed by Dr. Sun at U.S. patent application Ser. No. 10/255,787, wherein a transistor for shunting ESD pulse is used. Unlike traditional diode-train-based ESD protection circuit's high turn-ON voltage, it provides various voltage levels for triggering one or more ESD shunt path via one or more small diodes arranged in a series. It rapidly shunts the ESD current via large current carrying transistors in a diode configuration to reduce the impact of the ESD event. Furthermore, it exhibits a reduced parasitic loading effect with the use of small triggering diodes and shunting transistors for the susceptible RF circuit.

In a RF circuit, power amplifier (PA) is the most popular component. The implement of heterojunction bipolar transistors (HBT) for compound semiconductor power amplifier is conventional and also susceptive to parasitic capacitance effect in rf modules. Therefore, Dr. Ma and Dr. Bar disclosed an ESD protection circuit for RF amplifier in InGaP/GaAs HBTs at U.S. patent application Ser. No. 10/501,651, wherein a Darlington pair of HBT instead of the shunting transistor is implemented for shunting large ESD current. For the same epitaxy, the ESD protection circuit with HBT Darlington pair can be integrated with the RF amplifier in InGaP/GaAs HBTs on the same chip. The on-chip ESD protection circuit design can reduce cost, space and power consumption. Furthermore, by arranging more Darlington pairs of HBT in a series, the parasitic effect can be lowered down for not degrading RF and output power performance.

Besides HBT power amplifiers, pseudomorphic high electron mobility transistor (pHEMT) and metal semiconductor FET (MESFET) are also conventional in many implementing RF circuits for their advantages of high signal to noise ratio and low cost. Because their epitaxy growth is totally different with HBT's, the on-chip ESD protection circuit with HBT Darlington pair is not suitable for RF circuit in pHEMTs or MESFETs anymore. Therefore, the shunting transistors in ESD protection circuit has to be replaced by pHEMTs or MESFETs. Note that depletion mode (D-mode) pHEMT/MESFET is a normally on transistor unlike HBTs or bipolar junction transistors (BJTs). In the common operating configuration, event in a negative voltage operation, the D-mode pHEMT/MESFET with its gate coupled to triggering diode string will be conducted and affects the normal of protected circuit. Thus, in the present invention, the enhancement mode (E-mode) pHEMTs or MESFETs are used to replace the shunting transistors in the ESD protection circuit.

SUMMARY OF THE INVENTION

In the present invention, an ESD protection circuit comprising a trigging diode string and a shunting transistor is disclosed. The triggering diode string can trigger the shunting transistor to conduct ESD current away rapidly when it is suffered a voltage spike. In the present invention, because the protected RF circuit is in HEMTs/MESFETs, the shunting transistor is therefore replaced by a HEMT/MESFET for on-chip ESD protection circuit design. An on-chip ESD protection circuit can save the chip space and product cost, and lower down power consumption. Because the on-chip ESD protection circuit in HEMTs/MESFETs chip must be at nonconducting configuration under normal operating voltage, a triggering diode string and a normally off enhancement mode (E-mode) HEMT/MESFET having its gate coupled to the triggering diode string are necessary. Additionally, the dual-gate design in the present invention reduces the parasitic capacitance of ESD protection for RF circuit performance without expanding device size.

In order to get a clear idea of the present invention, detailed description of the preferred embodiments and corresponding drawings are followed to address the advantages, purposes, and characters of the present invention.

BRIEF DESCRIPTION OF THE DRAWINGS

FIG. 1-1 shows the voltage-time curve for voltage spike between the pad point and the ground point.

DETAILED DESCRIPTION OF THE PREFERRED EMBODIMENTS

Figure 1:
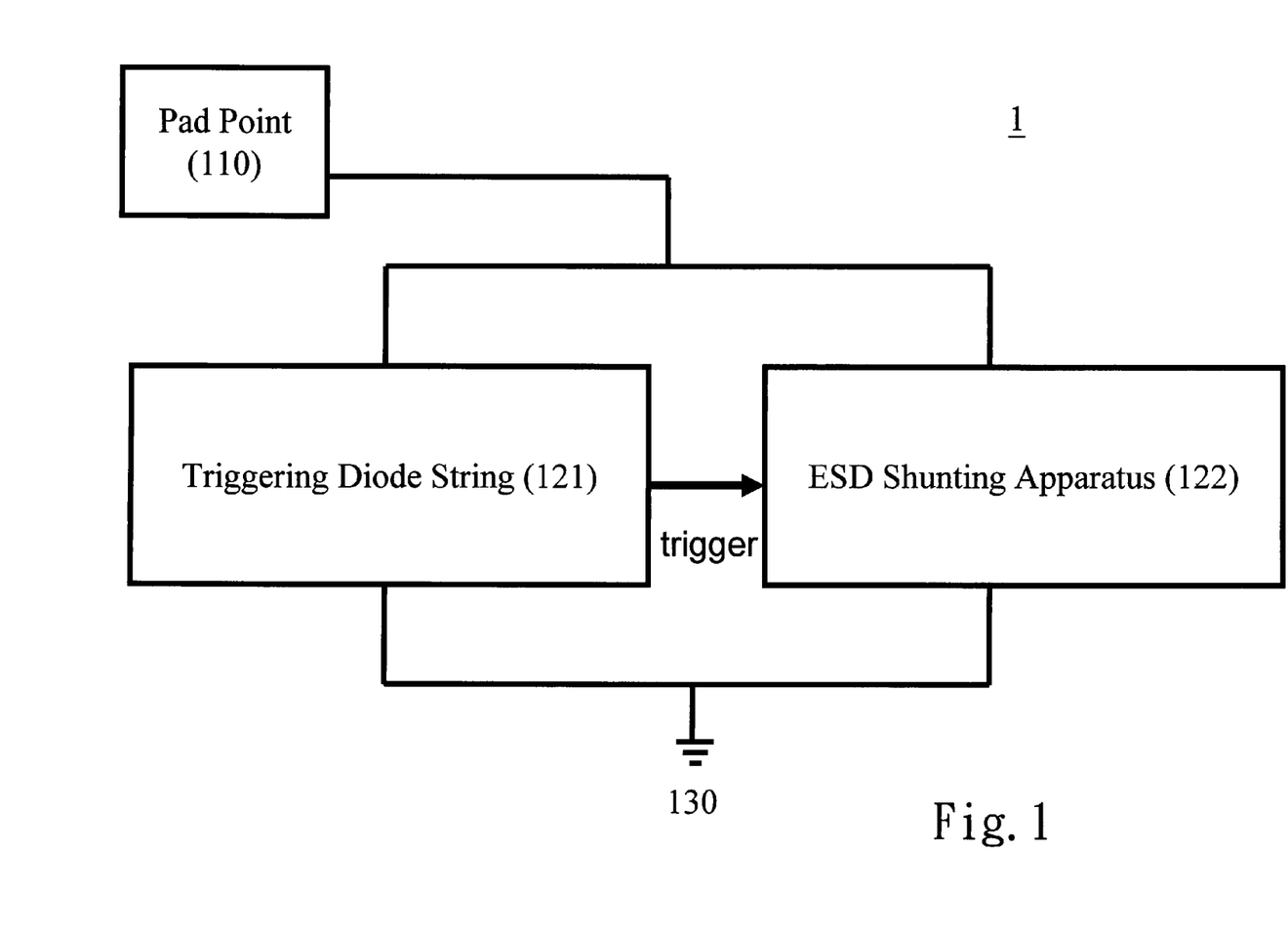
FIG. 1 shows the circuit block of ESD protection circuit in the present invention.
Figure 2:
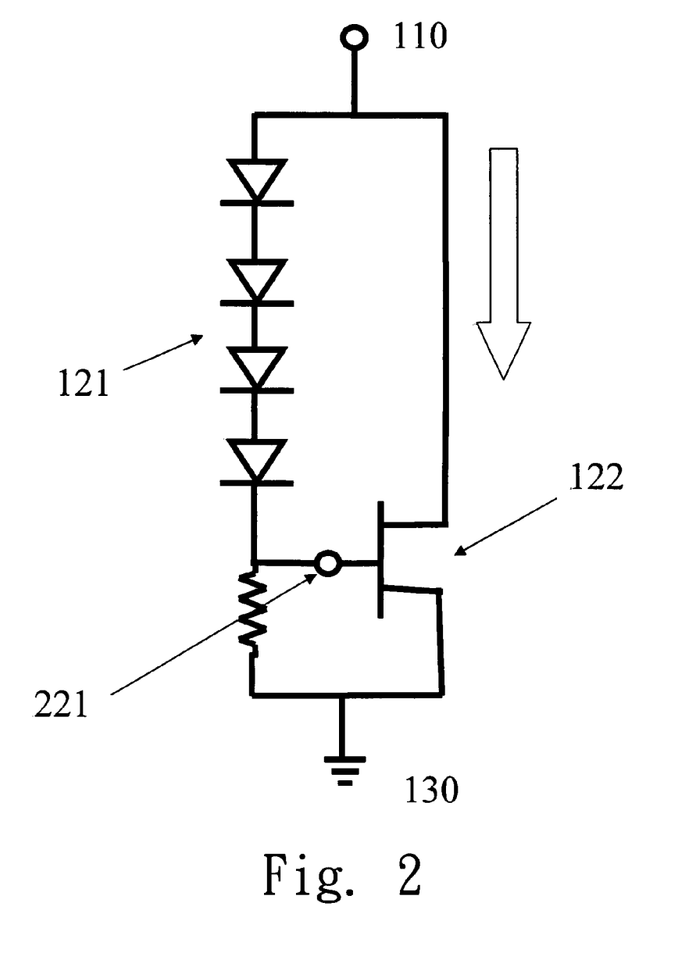
FIG. 2 shows the circuit design for an embodiment of ESD protection circuit in the present invention.
Figure 11:
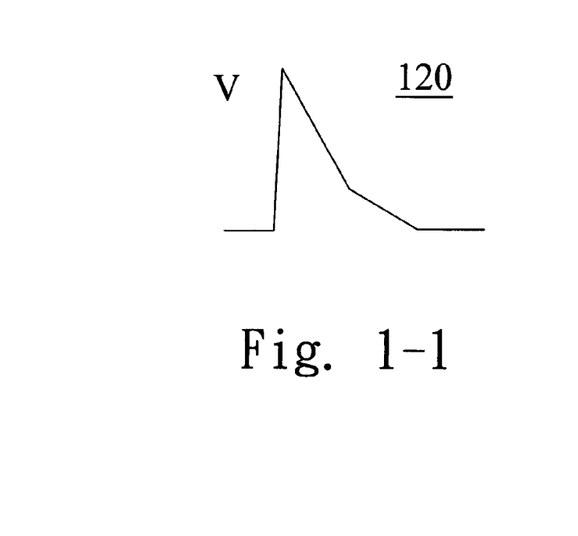

A shunting ESD protection circuit of the present invention is simply shown on FIG. 1. The ESD protection circuit connected between a pad point 110 to the main RF circuit input and a ground point 130 to ground comprises a triggering diode string 121 and a ESD shunting apparatus 122. The working principle of the shunting ESD protection circuit is to rapidly conduct the ESD current to ground point when the unexpected voltage spike between the pad point and the ground point is happened (as FIG. 1-1), and to be a nonconducting circuit when the voltage between the pad point and the ground point is in normal operation. FIG. 2 shows the detail working sequence. When a voltage spike between the pad point and the ground point is larger than the forward bias threshold of the triggering diode string, the voltage between gate 221 of the ESD shunting apparatus and the ground point becomes positive and switches the ESD shunting transistor to be conducted. The conducted ESD shunting apparatus can rapidly conduct large ESD current from the pad point to the ground point to protect the main RF circuit. In the present embodiment, the ESD shunting apparatus comprises a plurality of enhancement mode pseudomorphic high electron mobility transistor/metal semiconductor FET (E-mode pHEMT/MESFET)

Under the minimum triggering criterion, number of diodes of the triggering diode string is less as possible to not trigger the ESD shunting apparatus in normal operating voltage for device size optimization. For example, if the normal operating voltage is $V_{pad}$ and forward bias threshold voltage is $V_{th}$, the minimum number of diode N is the larger integral of $V_{pad}/V_{th}$. Note that, for the positive triggering voltage, the on-chip ESD shunting apparatus in HEMTs/MESFETs should comprises a plurality of normally off E-mode pHEMT/MESFET but not normally on depletion mode (D-mode) pHEMT/MESFET.

Figure 3:
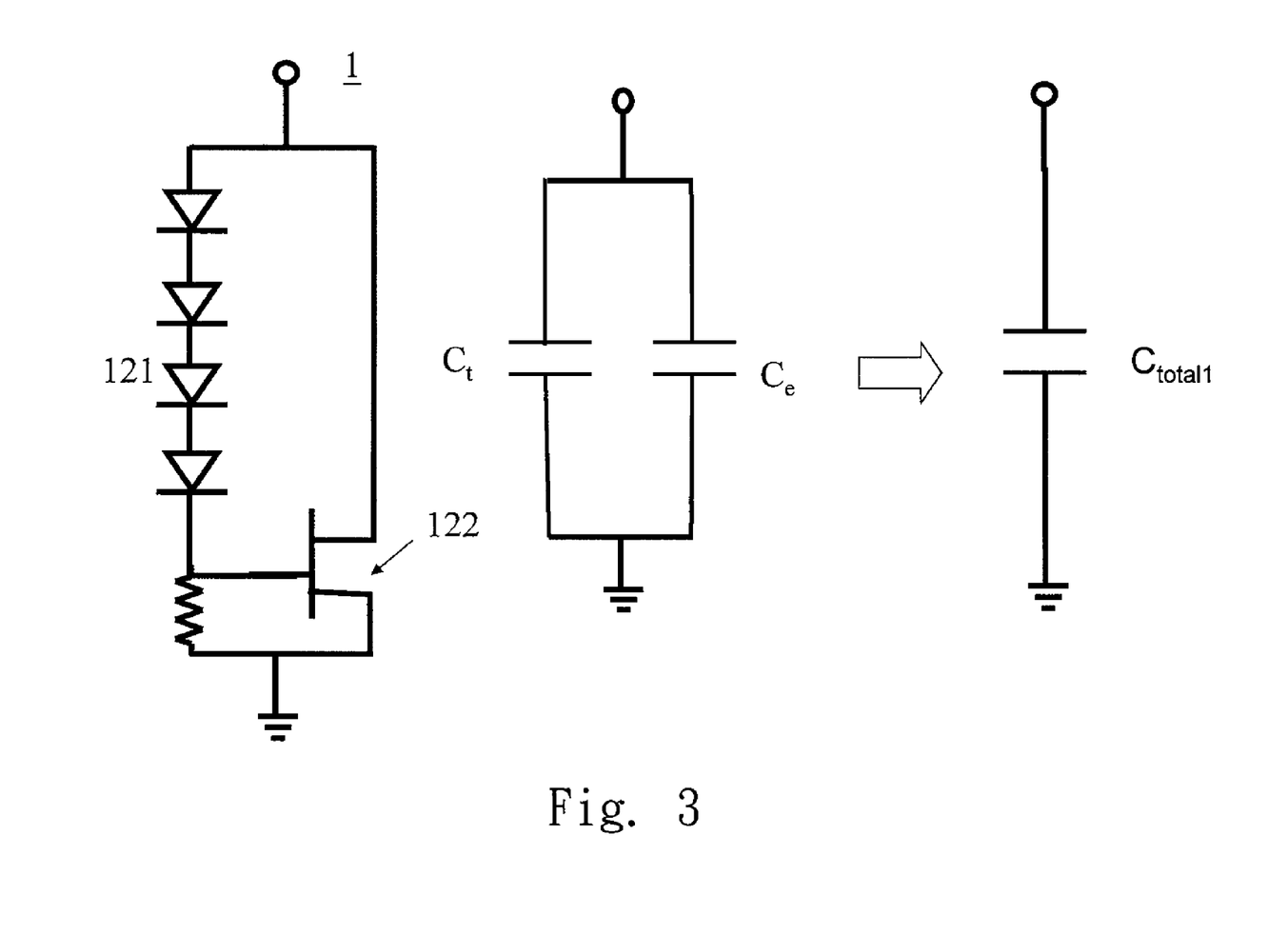
FIG. 3 shows the sketch of parasitic capacitance resulting from the effective capacitance of ESD protection circuit with a single E-mode pHEMT/MESFET.
Figure 4:
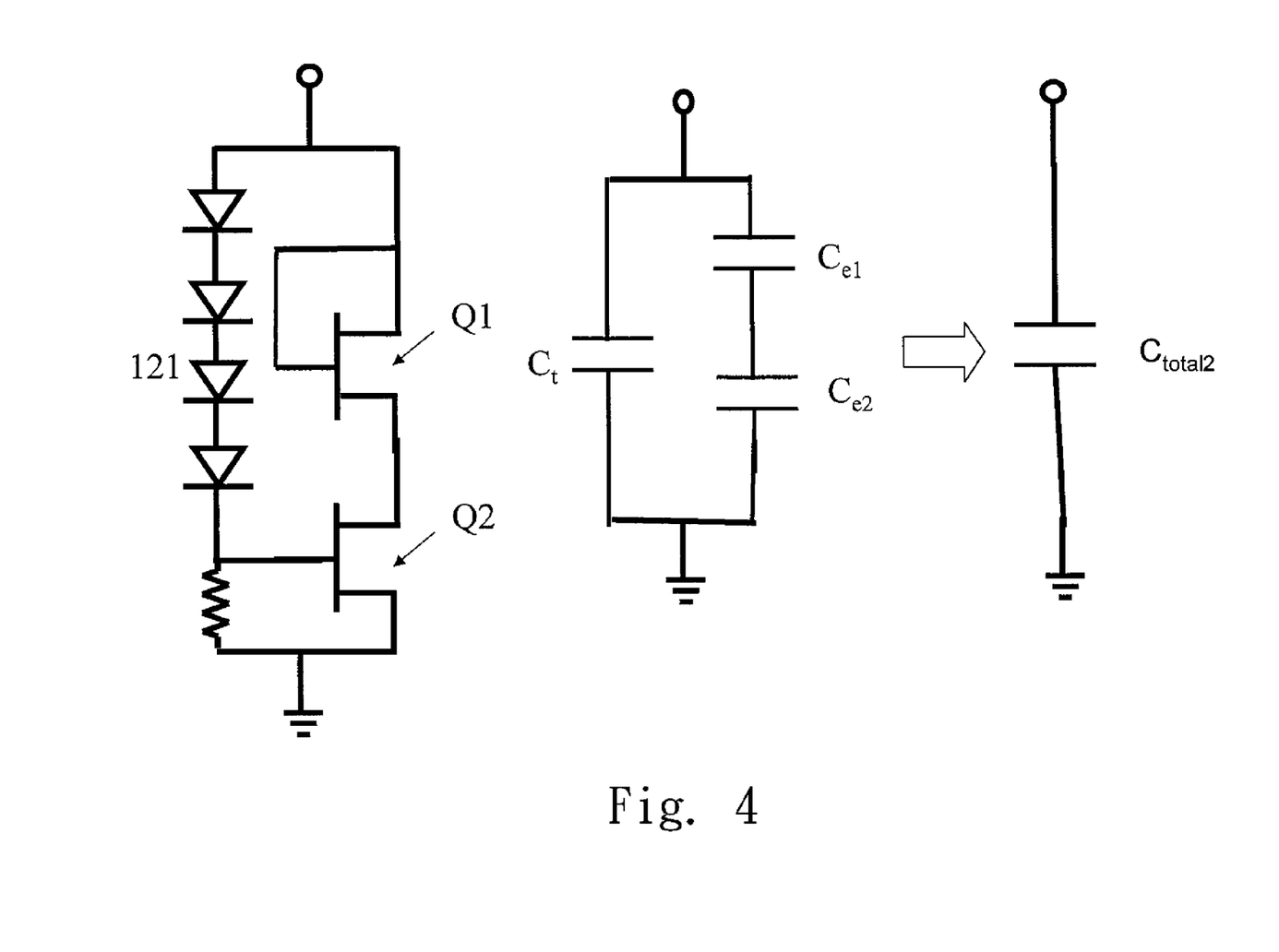
FIG. 4 shows the sketch of parasitic capacitance resulting from the effective capacitance of ESD protection circuit with E-mode pHEMT/MESFET in a series in the present invention.

FIG. 3 shows the parasitic capacitance of ESD protection circuit is coming from the triggering diode string and the E-mode pHEMT/MESFET. $C_t$ is the effective capacitance of the triggering diode string and $C_e$ is the effective capacitance of the E-mode pHEMT/MESFET. For $C_e \gg C_t$, the total effective capacitance $C_{total1} \sim C_e$. As mentioned before, in order to not degrade the RF circuit's performance, the parasitic capacitance of ESD protection circuit is small as possible. Arranging the more E-mode pHEMT/MESFET in a series is getting the less parasitic capacitance. As shown in FIG. 4, the total effective capacitance $C_{total2}=C_t+1/(1/C_{e1}+1/C_{e2})\sim C_{e1}/2$. It is almost the half of original capacitance. However, to double the E-mode pHEMT/MESFET Q1, Q2 in a series not only makes half the parasitic capacitance, but also doubles the device size. In practical, the space saved by on-chip design is futile after all.

Figure 5:
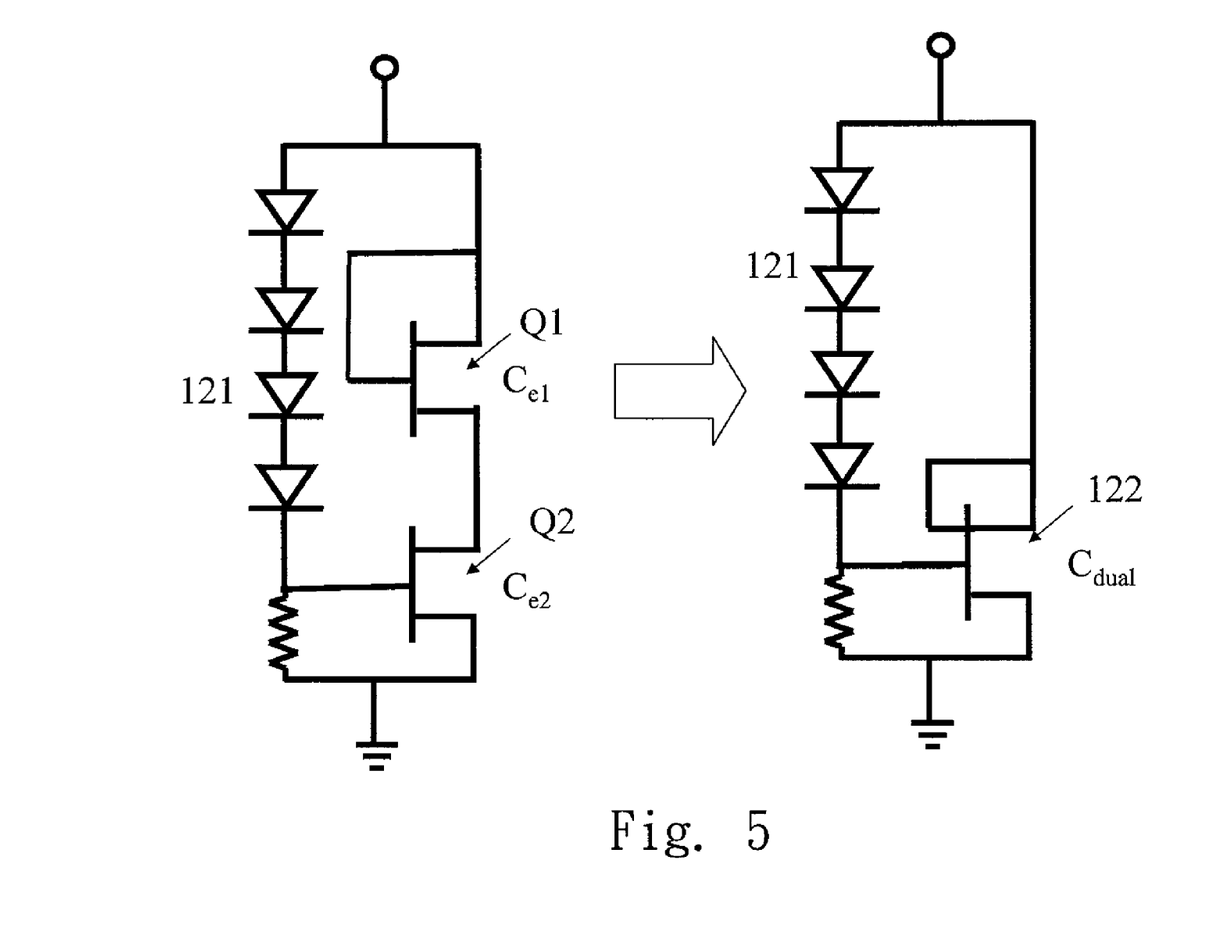
FIG. 5 shows the left part of the circuit depicted in FIG. 4 and the circuit design of a dual-gate E-mode pHEMT/MESFET of the present invention.
Figure 6:
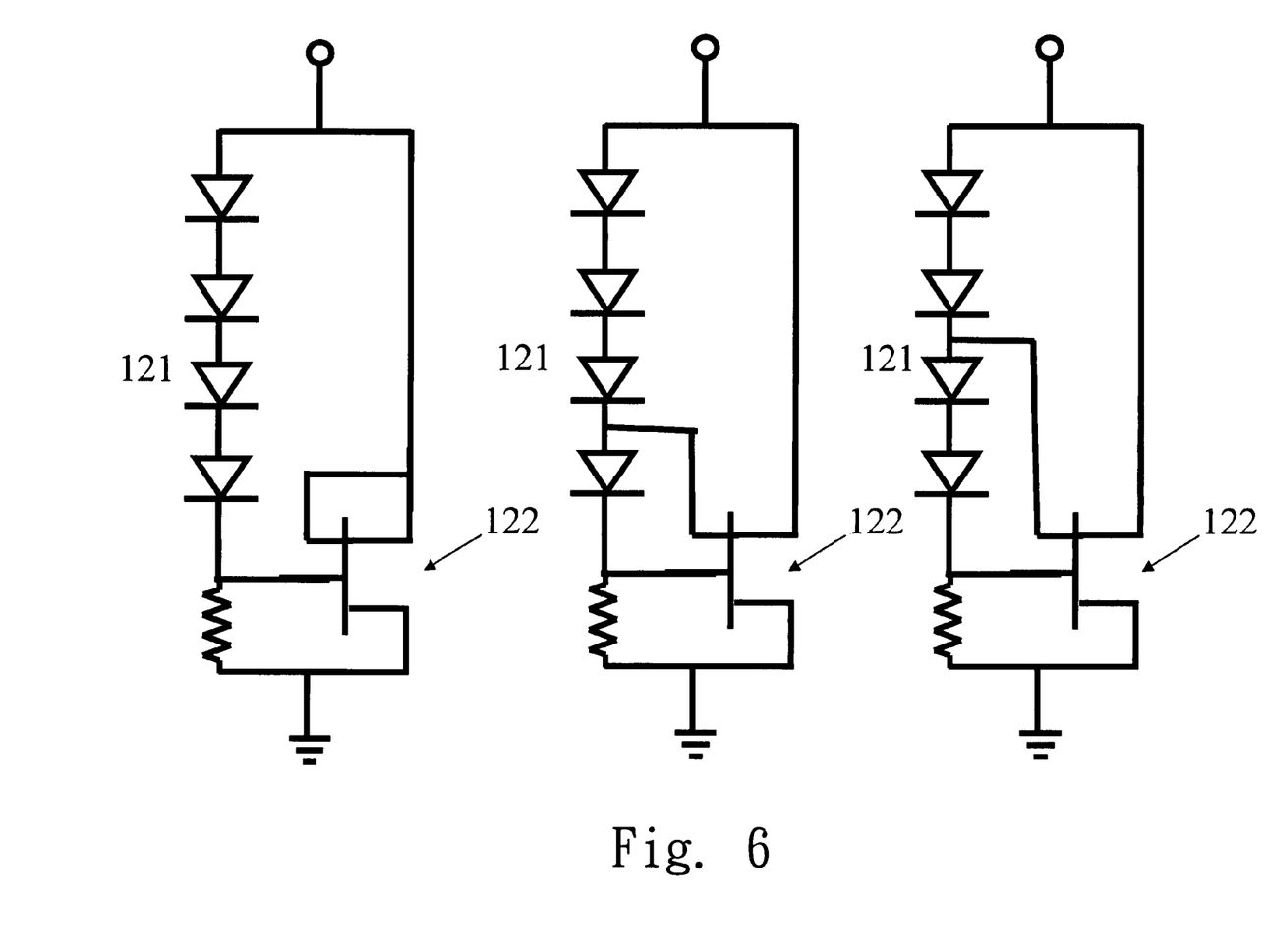
FIG. 6 shows different circuit designs for dual-gate E-mode pHEMT/MESFET in the present invention.

A further technical break-through to reduce parasitic capacitance without expanding device size is shown in the FIG. 5. Keeping the same device size as the one E-mode pHEMT/MESFET, but having its first gate coupled to the triggering diode string for switch configuration and its second gate coupled to its drain gate will reduce the intrinsic capacitance apparently. The second gate is not only coupled to the drain gate, but also to the pad point or any nodal point on the triggering diode string for reducing parasitic capacitance and for the demon of various triggering voltage (see FIG. 6).

Figure 7:
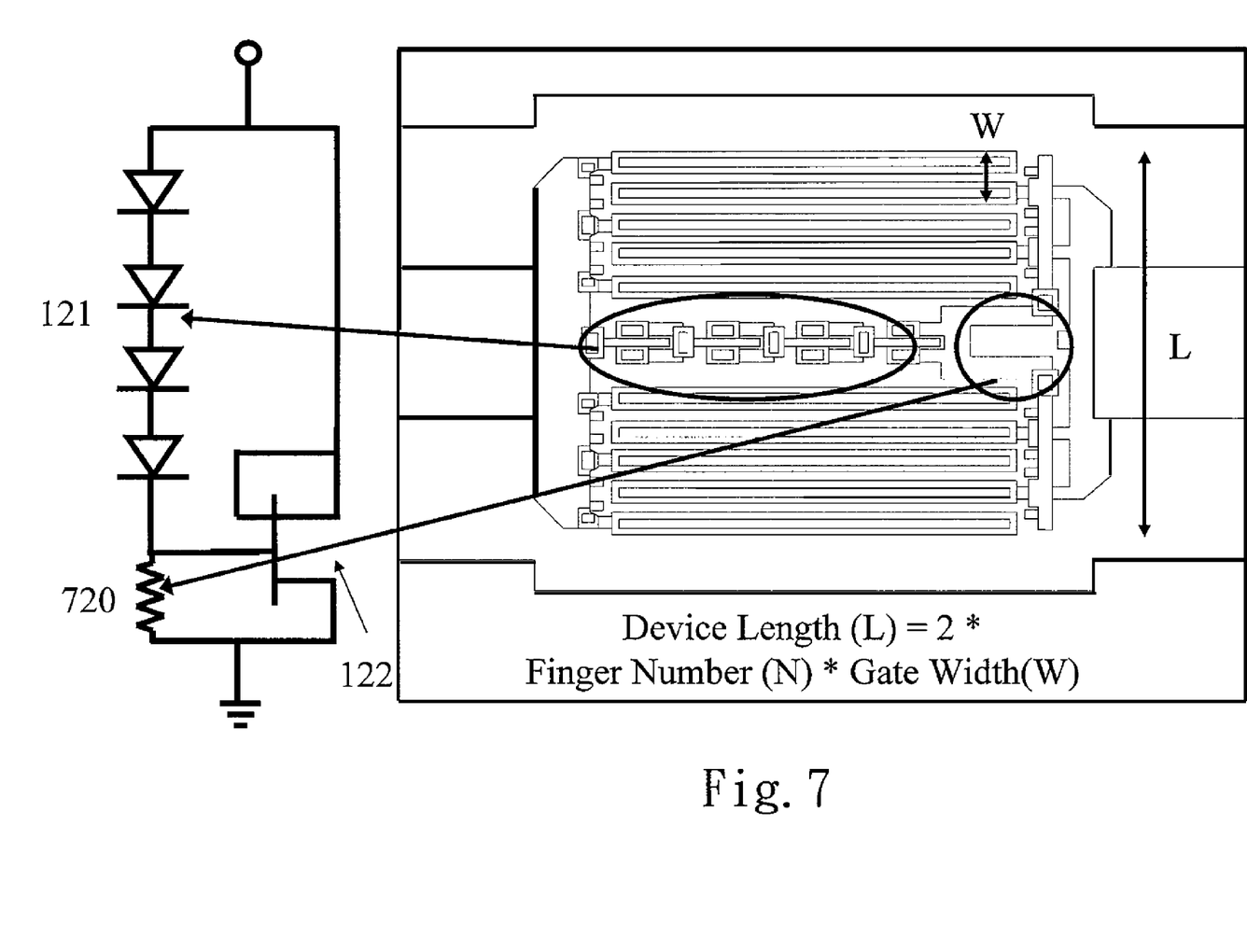
FIG. 7 shows the layout for an embodiment of the on-chip ESD protection circuit using E-mode HEMT/MESFET technology according to the present invention.

FIG. 7 shows the layout for one embodiment of the on-chip ESD protection circuit using E-mode HEMT/MESFET technology. A resistor 720 coupled between the triggering diode string 121 and the ground point is used for various triggering voltage. Fingers of the multi-finger layout of the E-mode pHEMT/MESFET are distributed on both sides of the triggering diode string. The finger number N comes from device length L and gate width W, $N=L/(W*2)$, wherein 2 means symmetrical sides distribution. For example, the finger number N will be four for device length L=1 mm and gate width W=125 µm and N will be eight for device length L=1 mm and gate width W=62.5 µm.

Accordingly, as disclosed by the above description and accompanying drawings, the present invention surely can accomplish its objective to provide an On-chip ESD protection circuit which can save the chip space and reduce the parasitic capacitance therein, and may be put into industrial use.

It should be understood that various modifications and variations could be made from the teaching disclosed above by the persons familiar in the art, without departing the spirit of the present invention.

What is claimed is:

1. An on-chip ESD protection circuit using enhancement mode high electron mobility transistor (E-mode HEMT)/metal semiconductor FET (MESFET) technology, for using between a pad point to main RF circuit input and a ground point to ground, comprising:
   a triggering diode string connected between the pad point and the ground pint; and
   a plurality of E-mode HEMT/MESFET having gates coupled to the triggering diode string connected between the pad point and the ground point in parallel to the triggering diode string, wherein the plurality of E-mode HEMT/MESFET triggered by the triggering diode string to shunt the voltage spike between the pad point and the ground point,
   wherein the plurality of E-mode HEMT/MESFET having dual gates capable of reducing parasitic capacitance for implement of RF circuits and optoelectronic integrated circuits (OEIC), a first gate of the plurality of E-mode HEMT/MESFET coupled to the triggering diode string for switch configuration and a second gate of the plurality of E-mode HEMT/MESFET coupled to drain.

2. The on-chip ESD protection circuit according to claim 1, wherein a resistor is connected between the triggering diode string and the ground point for various triggering voltage.

3. The on-chip ESD protection circuit according to claim 1, wherein a layout of the plurality of dual-gate E-mode HEMT/MESFET is a multi-finger layout having finger structure on symmetrical sides of the triggering diode string.

4. The on-chip ESD protection circuit according to claim 3, wherein the size of the plurality of dual-gate E-mode HEMT/MESFET is 1 mm=4 (finger number)×125 µm (gate width)×2.

5. The on-chip ESD protection circuit according to claim 3, wherein the size of the plurality of dual-gate E-mode HEMT/MESFET is 1 mm=8 (finger number)×62.5 µm (gate width)×2.

6. The on-chip ESD protection circuit according to claim 3, wherein the size of the plurality of dual-gate E-mode HEMT/MESFET equals to the product of the finger number multiplying the gate width multiplying a side number of symmetrical distribution.

7. The on-chip ESD protection circuit according to claim 1, wherein the connection way and number of the triggering diode string satisfying the triggering diode string in a non-conducting configuration under normal operating voltage.

8. An on-chip ESD protection circuit using enhancement mode high electron mobility transistor (E-mode HEMT)/ metal semiconductor FET (MESFET) technology, for using between a pad point to main RF circuit input and a ground point to ground, comprising:
   a triggering diode string connected between the pad point and the ground pint; and
   a plurality of E-mode HEMT/MESFET having gates coupled to the triggering diode string connected between the pad point and the ground point in parallel to the triggering diode string, wherein the plurality of E-mode HEMT/MESFET triggered by the triggering diode string to shunt the voltage spike between the pad point and the ground point,
   wherein the plurality of E-mode HEMT/MESFET having dual gates capable of reducing parasitic capacitance for implement of RF circuits and optoelectronic integrated circuits (OEIC), a first gate of the plurality of E-mode HEMT/MESFET coupled to the triggering diode string for switch configuration and a second gate of the plurality of E-mode HEMT/MESFET coupled to any nodal point on triggering diode string.

9. The on-chip ESD protection circuit according to claim 8, wherein a resistor is connected between the triggering diode string and the ground point for various triggering voltage.

10. The on-chip ESD protection circuit according to claim 8, wherein a layout of the plurality of dual-gate E-mode HEMT/MESFET is a multi-finger layout having finger structure on symmetrical sides of the triggering diode string.

11. The on-chip ESD protection circuit according to claim 10, wherein the size of the plurality of dual-gate E-mode HEMT/MESFET equals to the product of the finger number multiplying the gate width multiplying a side number of symmetrical distribution.

12. The on-chip ESD protection circuit according to claim 10, wherein the size of the plurality of dual-gate E-mode HEMT/MESFET is 1 mm=4 (finger number)×125 μm (gate width)×2.

13. The on-chip ESD protection circuit according to claim 10, wherein the size of the plurality of dual-gate E-mode HEMT/MESFET is 1 mm=8 (finger number)×62.5 μm (gate width)×2.

14. The on-chip ESD protection circuit according to claim 8, wherein the connection way and number of the triggering diode string satisfying the triggering diode string in a non-conducting configuration under normal operating voltage.

* * * * *